United States Patent
Navarro et al.

(10) Patent No.: US 12,010,934 B2
(45) Date of Patent: Jun. 11, 2024

(54) SELECTION ELEMENT WITH A PLURALITY OF AMORPHOUS LAYERS

(71) Applicant: Commissariat à l'Énergie Atomique et aux Énergies Alternatives, Paris (FR)

(72) Inventors: Gabriele Navarro, Grenoble (FR); Mathieu Bernard, Grenoble (FR); Chiara Sabbione, Grenoble (FR); Marie-Claire Cyrille, Grenoble (FR); Camille Laguna, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 14 days.

(21) Appl. No.: 17/168,686

(22) Filed: Feb. 5, 2021

(65) Prior Publication Data
US 2021/0249599 A1    Aug. 12, 2021

(30) Foreign Application Priority Data
Feb. 7, 2020 (FR) ...................................... 2001228

(51) Int. Cl.
*H10N 70/00* (2023.01)

(52) U.S. Cl.
CPC ....... *H10N 70/8825* (2023.02); *H10N 70/026* (2023.02); *H10N 70/8822* (2023.02); *H10N 70/8828* (2023.02)

(58) Field of Classification Search
CPC ... H01L 45/143; H01L 45/142; H01L 45/144; H01L 45/1625; H01L 45/1233; H01L 45/141; H01L 45/16; H01L 45/124; H10N 70/8825; H10N 70/026; H10N 70/8822; H10N 70/8828; H10N 70/011; H10N 70/826; H10N 70/882; H10N 70/8265
See application file for complete search history.

(56) References Cited

U.S. PATENT DOCUMENTS

| | | |
|---|---|---|
| 2003/0133339 A1 | 7/2003 | Estes et al. |
| 2004/0175859 A1* | 9/2004 | Campbell ........... H01L 45/1625 438/102 |
| 2012/0305876 A1 | 12/2012 | Baek et al. |
| 2017/0250222 A1* | 8/2017 | Wu ........................ H01L 45/06 |
| 2019/0115393 A1* | 4/2019 | Cheng ................... H01L 45/141 |
| 2020/0035916 A1* | 1/2020 | Trinh ..................... H10B 63/80 |
| 2020/0152867 A1* | 5/2020 | Chiang ............... H01L 45/1246 |
| 2021/0043835 A1* | 2/2021 | Trinh .................. H10N 70/063 |

OTHER PUBLICATIONS

Preliminary Search Report for French Application No. 2001228, dated Oct. 9, 2020.

* cited by examiner

*Primary Examiner* — Jerome Leboeuf
(74) *Attorney, Agent, or Firm* — Wolf, Greenfield & Sacks, P.C.

(57) ABSTRACT

A selection element including, in a first portion, a stack of amorphous layers, the thickness of each layer in the stack being smaller than or equal to 20 nm.

16 Claims, 8 Drawing Sheets

SELECTION ELEMENT WITH A PLURALITY OF AMORPHOUS LAYERS

CROSS REFERENCE TO RELATED APPLICATIONS

This application claims priority to French application number 2001228, filed Feb. 7, 2020. The contents of this application is incorporated herein by reference in its entirety.

TECHNICAL BACKGROUND

The present invention generally concerns memory selection elements and more particularly selection elements based on phase-change materials.

PRIOR ART

Phase-change materials are materials based on chalcogenide materials having a resistance that may vary during the heating of this material, for example, under the effect of specific electric pulses applied between two electrodes. A transition occurs between an ordered, thermodynamically stable, crystalline phase, having a low resistance, and a disordered, thermodynamically unstable, amorphous phase, having a high resistance. Since the electric resistance of an amorphous material is significantly greater than the electric resistance of a crystalline material, this phenomenon is often used in phase-change memories to define two memory states, for example, 0 and 1, differentiated by the resistance measured through the phase-change material. Other components may however be manufactured by means of phase-change materials, for example, selection elements, also called ovonic threshold switches or OTSs.

The alloys used to form these components are often by stoichiometric proportions. Alloys having non-stoichiometric proportions may however be preferred to alloys having stoichiometric proportions since they may have desired characteristics, for example, a higher crystallization temperature. However, the manufacturing of selection elements comprising such alloys has various disadvantages. Particularly, the phase separation and/or the possible crystallization of such alloys may cause a degradation of the functionality of the selection element.

SUMMARY

An embodiment overcomes all or part of the disadvantages of known selection elements.

An embodiment provides a selection element comprising, in a first portion, a stack of amorphous layers, the thickness of each layer in the stack being smaller than or equal to 20 nm.

According to an embodiment, at least one of the layers in the stack comprises a group-16 element.

According to an embodiment, the stack comprises at least one assembly of first layers and one assembly of second layers, the first and second layers being made of different materials.

According to an embodiment, the first layers are made of an alloy comprising a group-15 element and a group-16 element, and wherein the second layers are made of:
- a group-14 element, alone or doped, for example, nitrogen-, oxygen-, or carbon-doped; or
- an alloy comprising a group-14 element and a group-16 element.

According to an embodiment, the stack comprises an alternation of first and of second layers.

According to an embodiment, the first layers are made of a nitrogen-doped germanium alloy, and the second layers are made of an alloy of antimony and of selenium.

According to an embodiment, the material of each layer in the stack has stoichiometric proportions.

According to an embodiment, the element comprises a second portion crossing at least certain layers of the stack, made of an alloy of at least part of the components of the layers of the stack.

According to an embodiment, the element comprises an electrode in contact with the second portion.

According to an embodiment, layers of an assembly of layers of the stack are doped.

According to an embodiment, the layers of the layer assembly are doped with one or a plurality of dopants among nitrogen, carbon, and silicon.

Another embodiment provides a memory device comprising a storage element arranged electrically in series with a previously-defined selection element.

Another embodiment provides a method of manufacturing a selection element comprising forming a stack of amorphous layers, the thickness of each layer being smaller than or equal to 20 nm.

According to an embodiment, the method comprises a step during which a current pulse is sent through the stack of layers, to form a portion comprising an alloy of at least part of the components of the layers of the stack.

According to an embodiment, the method comprises a step of manufacturing of a lower electrode and the manufacturing of an upper electrode.

According to an embodiment, the proportions of the material of the second portion are not stoichiometric.

According to an embodiment, the first and second portions are separated by a skin made of a material of one of the layers in the stack.

According to an embodiment, the material of the second portion is a phase-change material.

According to an embodiment, the doping of the layers of the layer assembly is gradual.

BRIEF DESCRIPTION OF THE DRAWINGS

The foregoing and other features and advantages of the present invention will be discussed in detail in the following non-limiting description of specific embodiments in connection with the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
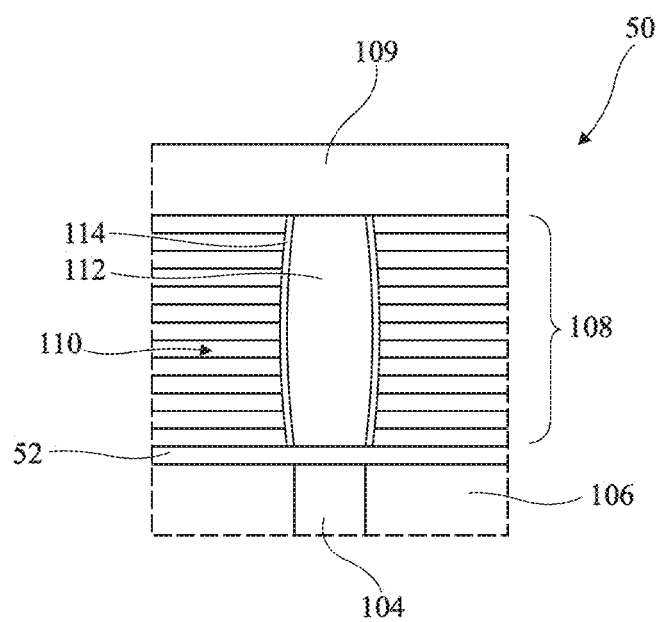
FIG. 1 is a partial simplified cross-section view of an embodiment of a selection element.

FIG. 1 is a partial simplified cross-section view of an embodiment of a selection element 50.

Selection element 50 comprises a first electrode 52, or lower electrode. In the example of FIG. 1, electrode 52 is a conductive layer. Electrode 52 is, in this example, in contact with a conductive via 104. Via 104 enables to couple the electrode to a node of application of a potential. Conductive via 104 is surrounded with an insulating layer 106. The thickness of layer 106 is such that the upper surface, or end, of via 104 is coplanar with the upper surface of insulating layer 106. The conductive layer forming electrode 52 rests on the upper surface of the via and on the upper surface of insulating layer 106.

Selection element 50 comprises a region 108. Region 108 comprises a first portion 110. After an initialization or firing step, which will be described in further detail hereafter, region 108 further comprises a second portion 112. Before the performed firing step, for example, before the first use of the element, region 108 only comprises first portion 110.

First portion 110 comprises a stack of layers, preferably all made of amorphous materials. Region 108 is located on electrode 52. Thus, the lower layer of stack 110 covers electrode 52. The layers in the stack are preferably made of chemical elements, or alloys of chemical elements, from groups 14, 15, or 16 of the periodic table of elements, according to the classification of the International Union of Pure and Applied Chemistry (IUPAC).

Group 14 comprises carbon (C), silicon (Si), germanium (Ge), tin (Sn), lead (Pb), and flerovium (Fl). Group 15 comprises phosphorus (N), phosphorus (P), arsenic (As), antimony (Sb), bismuth (Bi), and moscovium (Mc). Group 16 comprises oxygen (O), sulfur (S), selenium (Se), tellurium (Te), polonium (Po), and livermorium (Lv).

Each layer of stack 110 is made of a material preferably having stoichiometric or substantially stoichiometric proportions. Preferably, at least certain layers of stack 110, preferably all the layers of stack 110, comprise:
an alloy comprising a group-15 element and a group-16 element; or
a group-14 element, alone or doped, for example, nitrogen-, oxygen-, or carbon-doped; or
an alloy comprising a group-14 element and a group-16 element.

Preferably, at least one of the layers of stack 110 comprises one element among selenium, tellurium, and sulfur. The alloys of the layers of stack 110 are for example made of materials selected from the following list: $GeSe_2$, GeSe, $As_2Te_3$, $Sb_2Se_3$, $As_2Se_3$, N-doped or undoped Ge, $GeS_2$, GeS, $Sb_2S_3$, $As_2S3$. The alloys of the layers of stack 110 may for example be doped, for example, with nitrogen, oxygen, or carbon.

Stack 110 for example comprises an alternation of first and of second layers, the first and second layers being made of different materials. Preferably, the stack only comprises the first and second layers. Preferably, the first layers are for example made of an alloy comprising a group-15 element and a group-16 element. The second layers are preferably made of an alloy comprising a group-14 element and a group-16 element or of a group-14 element alone or doped, for example, nitrogen-, oxygen-, or carbon-doped.

The first layers are preferably made of an antimony and selenium alloy (SbSe), and the second layers are preferably made of a material based on germanium and on nitrogen, for example, of nitrogen-doped germanium (GeN). For example, the second layers are made of a material which is not a phase-change material.

Each of the layers of stack 110 has a thickness smaller than or equal to approximately 20 nm, for example, smaller than or equal to 5 nm. For example, each layer in the stack has a thickness greater than 1 nm.

For example, the thicknesses of the first layers, noted A, and of the second layers, noted B, may be determined in the previously-discussed range by solving the following equations:

$$T = (N_A * t_A + N_B * T_B) \qquad \text{[Math 1]}$$

$$P_A = 100 \times \frac{N_A * t_A}{N_A * t_A + N_B * t_B} \qquad \text{[Math 2]}$$

$$P_B = 100 \times \frac{N_B * t_B}{N_A * t_A + N_B * t_B} \qquad \text{[Math 3]}$$

where T is the total thickness of stack 110, $t_A$ is the thickness of a layer A, $t_B$ is the thickness of a layer B, $N_A$ is the number of layers A, $N_B$ is the number of layers B (equal to the number of layers A), $P_A$ is the proportion (in %) of the material of layers A in the entire stack, $P_B$ is the proportion (in %) of the material of layers B in the entire stack.

More generally, the stack comprises at least two assemblies of layers, each assembly comprising layers made of a material different from the materials of the layers of the other assemblies. Preferably, all the layers of a same assembly are made of a same material. The layers of a same assembly may have different doping levels. Preferably, all the layers of a same assembly are doped with the same dopants. However, according to an embodiment, certain layers of a same assembly may for example be doped with different dopants.

The first and second portions 110 and 112 may be separated by a skin 114 made of one of the chemical elements of stack 110. Preferably, skin 114 is made of a single material. The skin extends along the height of at least two layers of stack 110. Skin 114 is for example entirely made of an alloy forming one of the layers. Skin 114 is for example entirely made of a chemical material of one of the alloys forming one of the layers of the stack. For example, if stack 110 comprises GeN and SbSe layers, skin 114 may be made of germanium.

Second portion 112, resulting from the merging of layers of stack 110 as will be described hereafter, is in contact with the upper surface of layer 106 and the upper surface of electrode 52.

In the example of FIG. 1, the second portion extends all along the height of the stack. More generally, the second portion crosses at least certain layers of stack 110. Preferably, the second portion crosses at least two layers of the stack.

Second portion 112 is made of an alloy of at least some of the chemical elements and/or alloys of chemical elements, of the layers of stack 110. Preferably, the second portion is made of a single homogeneous material. Preferably, the material forming the second portion comprises all the chemical elements forming the layers of the stack. Second portion 112 is made of a phase-change material. Preferably, the second portion is for example made of an amorphous material during its use. Second portion 112 is for example made of a material having non-stoichiometric proportions. Second portion 112 is for example made of an alloy of germanium, of selenium, of antimony, and of nitrogen (GeSeSbN).

A conductive layer 109 rests on region 108. Conductive layer 109 forms a second electrode of the selection element, or upper electrode. Preferably, the second portion extends from one electrode to the other.

During the operation of the selection element, a voltage is applied between electrodes 52 and 109. If the applied voltage is greater than a threshold voltage, the selection element behaves similarly to an on switch.

Experiments have shown that, from a macroscopic point of view, that is, considering the entire stack as being a single element, the stack of layers has a behavior similar to that of a bulk made of an alloy comprising all the chemical elements of the layers of the stack.

However, the components of a bulk of an alloy having no stoichiometric proportions tend to recompose into stoichiometric elements, particularly when they are submitted to the relatively high temperatures of the manufacturing processes. This is the phase separation process and the possible consecutive crystallization of these phases. Such a recomposition results in a variability between selection elements which are otherwise substantially identical. The described embodiments, already comprising layers have stoichiometric proportions, are less subject to such recompositions.

Similar results can be observed for stacks comprising layers of previously-mentioned materials.

Such results cannot be observed for stacks of layers having thicknesses greater than 20 nm. Indeed, at the interfaces between two layers, the chemical elements of the two layers form connections, possibly alloys, in the same way as if the different chemical elements were gathered in a bulk. The considered thicknesses of the stacks of the described embodiments enable a sufficient portion of each layer to be subject to this phenomenon so that, from a macroscopic point of view, the stack substantially behaves as a bulk.

Figure 2:
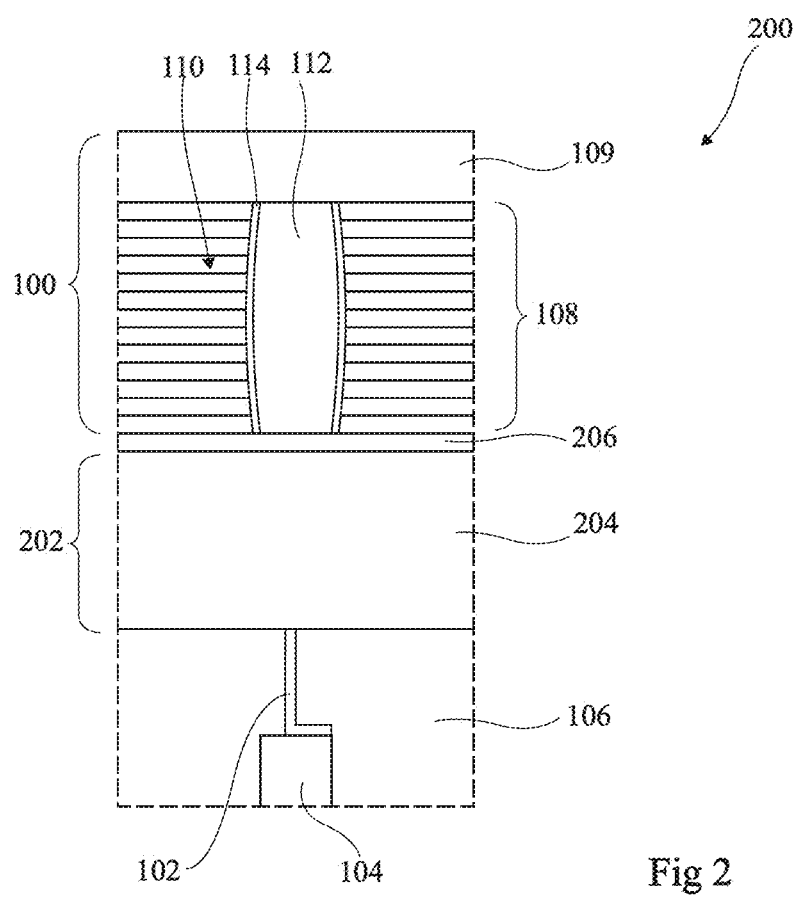
FIG. 2 is a partial simplified cross-section view of an embodiment of a memory cell.

FIG. 2 shows an embodiment of a memory cell 200 comprising a selection element 100. Memory cell 200 further comprises a storage element 202. In the example of FIG. 2, the storage element is a phase-change storage element. Storage element 202 thus comprises a layer, or a stack of layers, 204, made of a phase-change material.

Memory cell 200 comprises a first electrode 102, or lower electrode. In the example of FIG. 2, electrode 102 is located on conductive via 104. Electrode 102 is for example a resistive element. Electrode 102 for example has an L-shaped cross-section having its horizontal portion in contact with conductive via 104. Electrode 102 and conductive via 104 are surrounded with insulating layer 106. The thickness of layer 106 is such that the upper surface or end of the vertical portion of electrode 102 is coplanar with the upper surface of insulating layer 106.

Storage element 202 rests on the upper surface of insulating layer 106 and on the upper surface of the vertical portion of electrode 102. Electrode 102 may thus heat the material of the storage element to have it change phase, and thus to program the memory cell.

Selection element 100 is preferably located on storage element 202. As a variant, the position of the storage element and the position of the selection element may be inverted. Thus, the selection element may be located in contact with electrode 102 and be covered with the storage element.

Selection element 100 comprises, like the selection element 50 of FIG. 1, region 108. Region 108 comprises, as previously, portion 110, portion 112, and skin 114.

Selection element 100 is for example separated from storage element 202 by an interface layer 206. The interface layer is preferably a conductive layer, for example, a metal layer. Interface layer 206 is for example an electrode coupled to a node of application of a voltage. The interface layer for example covers the upper surface of the storage element and is for example covered with the selection element. The interface layer enables to ensure that the changes made in the composition of the storage element or of the selection element have no impact on the other element. For example, the interface layer enables to ensure that the crystallization of the storage element does not cause, even partially, the crystallization of the selection element.

During the operation of the memory cell, a voltage is applied between electrodes 102 and 109. If the applied voltage is greater than a threshold voltage, the selection element behave similarly to an on switch. A current can thus flows through the storage element and the selection element, to program or read the memory cell.

Figure 3:
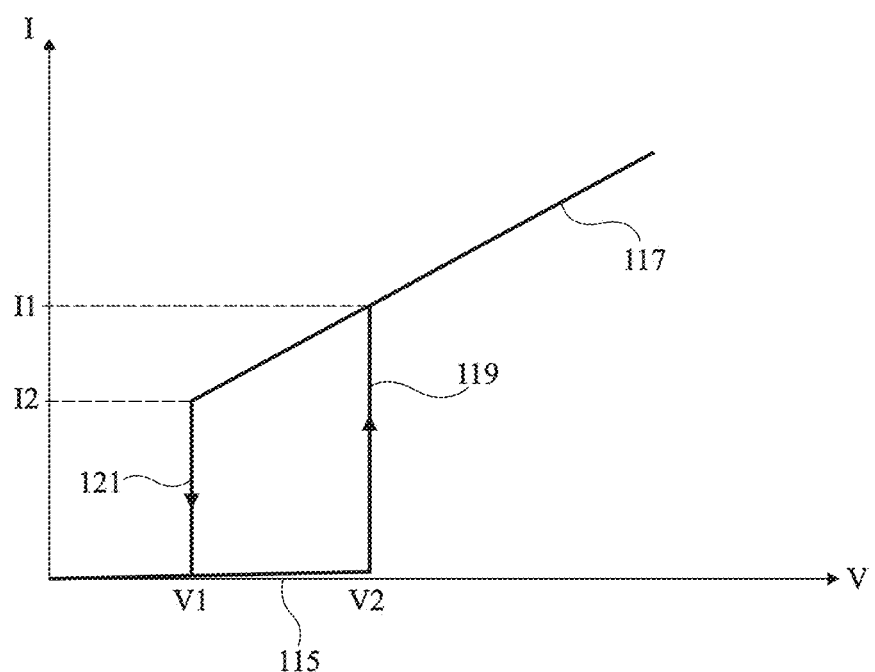
FIG. 3 illustrates the operation of the selection element of FIG. 1.

FIG. 3 illustrates the operation of the selection element 50 of FIG. 1, the operation of the selection element 100 of FIG. 2 being identical. FIG. 3 shows the characteristic of selection element 50, that is, the current I flowing through the selection element according to the voltage V across the selection element, that is, between electrodes 52 and 109.

The selection element takes a first state where the current I crossing the selection element is low and for example substantially constant. The current in the first state is for example substantially equal to 0. The resistivity of the stack is high, as well as that of the second portion, thus forbidding the flowing of the current from one electrode to the other, for example, towards a component series-coupled with the selection element, for example, a memory. This state is represented by curve portion 115. This first state is associated with low voltage values V, that is, values lower than a threshold voltage value V2.

When the selection element is in the first state and voltage V reaches value V2, the selection element enters a second state, shown by a portion of curve 117, after a short passage through a first intermediate state represented by a curve portion 119. The first intermediate state corresponds to a current jump, that is, the gradient of curve portion 119 is high.

When the selection element enters the second state, current I is equal to a current value I1. Further, current I is for example a linear function of the value of voltage V. Thus, in the second state, the current increases when the voltage increases. In this state, the resistivity of the second portion 112 is decreased, thus enabling the current to flow from one electrode to the other, for example, towards a component series-coupled with the selection element, for example, a memory.

To leave the second state and return to the first state, the voltage is decreased to reach a value V1 of the voltage, for example, smaller than voltage V2, corresponding to a value I2 of the current. When voltage V1 is reached, the selection element enters a second intermediate state represented by a curve portion 121 and then returns to the first state. The second intermediate state corresponds to another current jump, that is, the gradient of curve portion 121 is high.

The behavior of the selection element is similar to the behavior of a switch. Indeed, the selection element comprises two main states, a first state (off switch) where no current flows through the selection element or where only a low-noise current crosses the selection element, and a second state (on switch) where a current flows.

Preferably, region 108 is not submitted, during its operation as a selection element, to voltages sufficiently high to cause the crystallization of the region. Thus, in the second state, the second portion is preferably in an at least partially amorphous, preferably totally amorphous, state.

Figure 4:
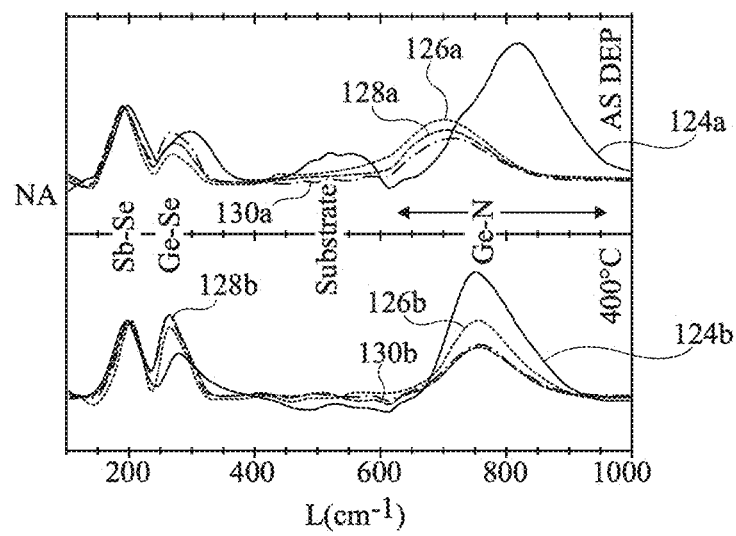
FIG. 4 is a graph showing the bonds between components present at different states of a plurality of embodiments of a selection element.

FIG. 4 is a graph showing the bonds present in selection elements such as that of FIG. 1. More particularly, FIG. 3 shows the absorption spectrum (NA) according to the wavelength (L(cm$^{-1}$)) for a plurality of selection elements during the deposition (AS DEP) of the layers of the selection element and after a heating of the selection elements to 400° C.

The absorption spectrum corresponds to the spectrum obtained (in cm$^{-1}$) by Fourier transform infrared spectroscopy. The higher the value of the absorbance at a given wavelength, the larger the number of bonds corresponding to this wavelength.

Curves 124a and 124b correspond to a selection element where the first and second portions 110 and 112 are replaced with a bulk of the material forming second portion 112, respectively on deposition (AS DEP) of the layers of stack 110 and for the heating of the selection element to 400° C.

Curves 126a and 126b correspond, respectively during the deposition (AS DEP) of the layers of stack 110 and during the heating of the selection elements to 400° C., to a selection element where the first layers are made of SbSe and the second layers are made of GeN. In this example, each first layer of stack 110 has a thickness substantially equal to 6 nm, and each second layer has a thickness substantially equal to 1 nm.

Curves 128a and 128b correspond, respectively during the deposition (AS DEP) of the layers of stack 110 and during the heating of the selection elements to 400° C., to a selection element where the first layers are made of SbSe and the second layers are made of GeN. In this example, each first layer of stack 110 has a thickness substantially equal to 5 nm, and each second layer has a thickness substantially equal to 1.5 nm.

Curves 130a and 130b correspond, respectively during the deposition (AS DEP) of the layers of stack 110 and during the heating of the selection elements to 400° C., to a selection element where the first layers are made of SbSe and the second layers are made of GeN. In this example, each first layer of stack 110 has a thickness substantially equal to 6 nm, and each second layer has a thickness substantially equal to 2 nm.

Curves 124, 126, 128, and 130 have been normalized with respect to the number of Sb—Se bonds of one of the curves.

During the deposition, curves 126a, 128a, 130a each show the presence, by a peak at the corresponding wavelength value, of SbSe and GeN bonds. These bonds are the bonds in the corresponding SbSe and GeN layers. Curves 126, 128, 130 further show a peak at the level of the wavelength value corresponding to Ge—Se bonds. These Ge—Se bonds are bonds formed at the level of the interfaces between the GeN and SbSe layers. Indeed, as previously mentioned, for layers having a thickness smaller than 20 nm, the chemical elements of the two layers form, at the interfaces of the layers, bonds, possibly alloys, in the same way as if the different chemical elements were gathered in a bulk.

Curve 124a exhibits peaks at the level of the wavelengths corresponding to the Sb—Se, Ge—Se, and Ge—N bonds, like curves 126a, 128a, and 130a. However, the peak corresponding to Ge—N bonds of curve 124a is substantially twice greater than the peak corresponding to Sb—Se bonds.

When the selection elements are heated up to 400° C., curves 124b, 126b, 128b, and 130b still comprise peaks at the level of the Sb—Se, Ge—Se, and Ge—N bonds.

The presence of the Ge—Se bonds causes the high resistivity of stack 110 in the first state. This enables to ensure a first state having a behavior similar to that of an off switch. Thus, the presence of Ge—Se links increases the resistivity of stack 110. However, the presence of Ge—Se links may also cause an increase in the threshold value (V2 in FIG. 2).

The presence of antimony (Sb enables to decrease the threshold voltage with respect to an element comprising a solid GeSe block instead of region 108. This decrease of the threshold voltage is at least partially caused by the forming of Se—Sb links. However, the presence of antimony (Sb) may cause a destabilization of the material of the first portion. Thus, the presence of antimony (Sb) may for example increase the risk of crystallization of a portion of the stack, in particular the SeSb layers, during the steps of manufacturing of the device comprising the selection element.

The presence of nitrogen (N) enables to stabilize the behavior of the stack and for example enables to delay the crystallization.

More generally, the different components may be replaced with components of the same groups, such as they have been previously described, to obtain similar behaviors.

Figure 5:
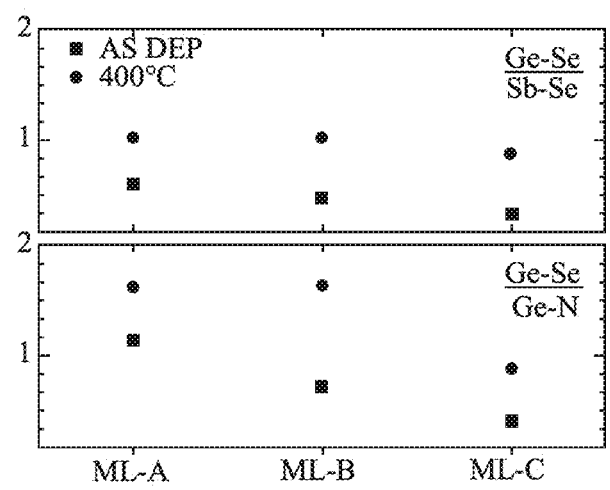
FIG. 5 illustrates examples of comparisons of numbers of bonds of FIG. 4.

FIG. 5 illustrates examples of comparisons of numbers of bonds of FIG. 4. In particular, FIG. 5 shows, on the one hand, the ratio of the number of Ge—Se bonds to the number of Sb—Se bonds, and on the other hand, the number of Ge—S bonds to the number of Ge—N bonds, during the deposition and when the selection elements are heated up to 400° C. The ratios are obtained for the cases where the layers of stack 110 have a thickness substantially equal to that described for the curves 130 (ML-A), for the curves 128 (ML-B) and for the curves 126 (ML-C) of FIG. 3.

It can be observed that the increase of the thickness of the layers causes a decrease in the number of Ge—Se bonds, as compared with the number of Sb—Se bonds and as compared with the number of Ge—N bonds. Indeed, when the thickness increases, the proportion of interfaces between layers, where the Ge—Se bonds form, decreases with respect to the volume of the layers, where the Sb—Se and Ge—N bonds are located.

Beyond a thickness value, for example, above 20 nm, the quantity of bonds formed at the interfaces is too low for the macroscopic behavior of stack 110 to correspond to the behavior of a bulk, as described in relation with FIG. 3.

Figure 6:
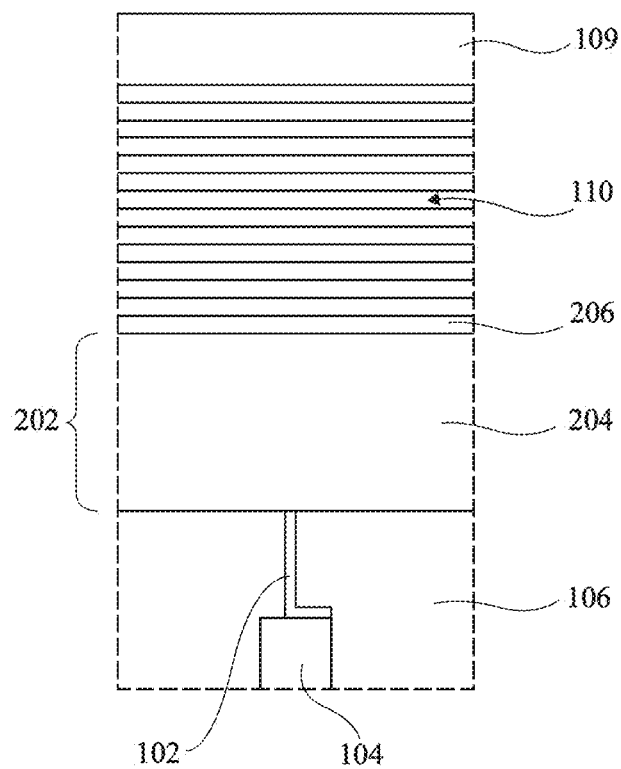
FIG. 6 schematically and partially shows a structure obtained at the end of a step of the manufacturing of the storage element of FIG. 2.
Figure 7:
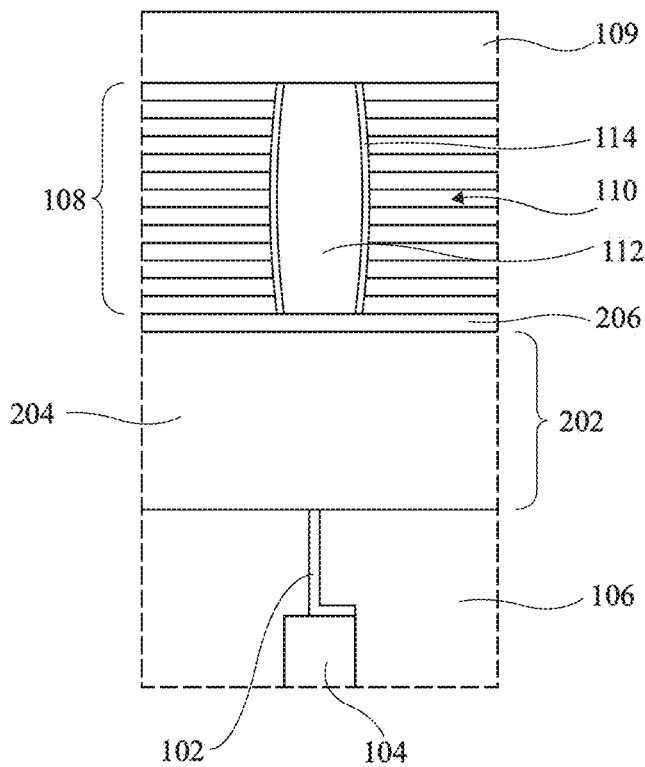
FIG. 7 partially and schematically shows a structure obtained at the end of another step of manufacturing of the memory cell of FIG. 2.

FIG. 6 partially and schematically shows a structure obtained at the end of the manufacturing of the memory cell of FIG. 2. FIG. 7 schematically and partially shows a structure obtained after the initialization or firing of the memory cell of FIG. 2.

The structure of FIG. 6 is obtained after steps comprising:
the forming of insulating layer 106;
the forming of conductive via 104;
the forming of electrode 102;
the forming of storage element 202, comprising for example the forming of the phase-change layer or of the stack of phase-change layers 204;
the forming of interface layer 206;
the forming of stack 110 on the upper surface of insulating layer 106 and on the upper surface of the vertical portion of resistive element 102. Stack 110 may comprise any number of layers, each layer having a thickness smaller than or equal to 20 nm, for example, smaller than or equal to 5 nm; and
the forming of conductive layer 109, covering the upper layer of stack 110.

The layers in the stack are for example formed one by one by physical vapor deposition (PVD).

The structure of FIG. 7 is obtained by running a significant current pulse between electrodes 102 and 109, which causes an increase in the temperature of region 108. The temperature of electrode 102 then becomes sufficient for stack 110 to pass through an initialization step, also called firing, during which second portion 112 is formed from the heated portions of the stack layers. Skin 114 may form at this step.

The method of manufacturing the selection element of FIG. 1 can be easily deduced from the above-described method.

Figure 8:
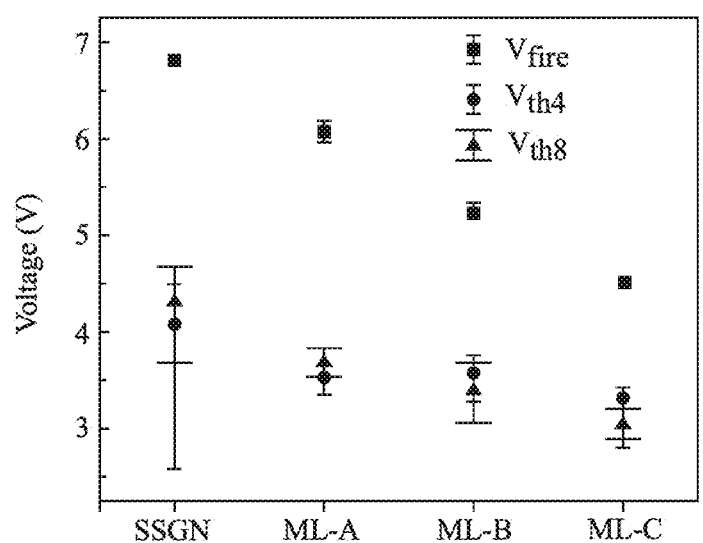
FIG. 8 shows voltage variations during the lifetime of a plurality of embodiments of a selection element.

FIG. 8 shows voltage dispersions (Voltage (V)) during the lifetime of a plurality of embodiments of a selection element. More particularly, FIG. 8 shows the dispersions of the firing voltage ($V_{fire}$), of the threshold voltage after 10,000 cycles ($V_{th4}$), and of the threshold voltage after 100,000,000 cycles ($V_{th8}$). These voltages are shown for the cases where the layers of stack 110 have a thickness substantially equal to that described for the curves 130 (ML-A), for the curves 128 (ML-B), and for the curves 126 (ML-C) of FIG. 4, and for the case where the stack is replaced with a bulk (SSGN). Dispersion means the range of values that may be taken by the associated voltage. This dispersion is for example obtained by measuring said voltage for a large number of selection elements formed in the same way. A cycle means the powering-on of the selection element to switch to the second state and the return to the first state.

The firing voltage corresponds to the voltage used to form the second portion in stack 110. The threshold voltage corresponds to the voltage at which the selection element switches from the first state to the second state (V2 in FIG. 3), that is, the minimum voltage to be applied to the selection element so that it behaves similarly to an on switch.

It can be observed that the dispersion of the firing voltage is small in all cases. It can further be observed that the firing voltage is more significant in the case where the stack is replaced with a layer of solid material than in the other cases. Further, the thicker the thickness of the layers in the stack, the lower the firing voltage.

Further, it can be observed that the dispersions of threshold $V_{th4}$ and $V_{th8}$ voltages are much lower in cases comprising a stack 110, as compared with the case where the stack is replaced with a bulk. Further, the thicker the thickness of the layers in the stack, the lower the threshold voltage.

Figure 9:
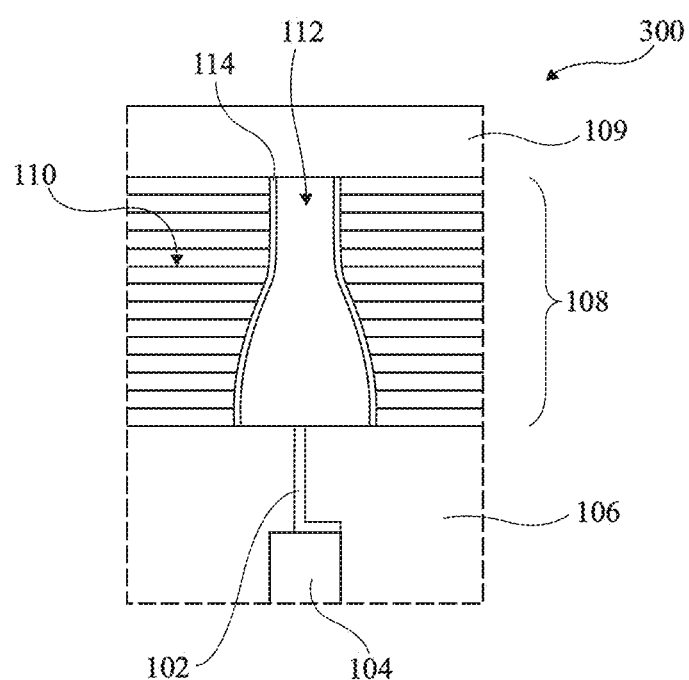
FIG. 9 is a partial simplified cross-section view of another embodiment of a selection element at the end of a manufacturing step.

FIG. 9 shows an embodiment of a selection element 300. The selection element comprises, as described in relation with FIG. 2, insulating layer 106, conductive via 104, and first electrode 102. The selection element comprises, as in FIG. 1, region 108, that is, first and second portions 110 and 112 as well as skin 114. Region 108 rests, in this embodiment, on layer 106 and on electrode 102, for example, on the upper surface of the vertical portion of electrode 102. More particularly, electrode 102 is in contact with second portion 112.

Figure 10:
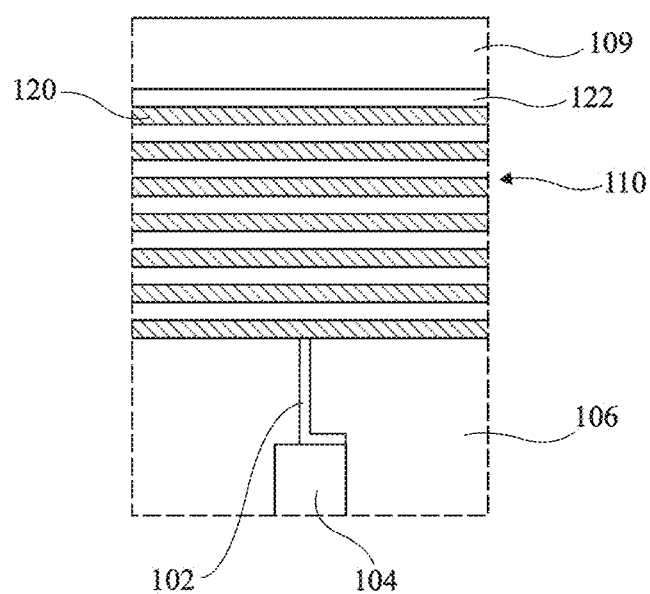
FIG. 10 shows another embodiment of a selection element.

FIG. 10 is a partial simplified cross-section view of another embodiment of a selection element.

More particularly, FIG. 10 shows a structure at a same manufacturing stage as the structure of FIG. 6, during the manufacturing of a selection element. The structure of FIG. 10 thus comprises all the elements of FIG. 6, except for storage element 202 and interface layer 206. In this example, the lower electrode is electrode 102, which is L-shaped. However, electrode 102 may be replaced with the electrode 52 of FIG. 1.

The stack 110 of the embodiment of FIG. 10 comprises layers 120 and 122. Layers 120 (hatched layers) are doped and layers 122 are not doped. The doping of layers 120 is preferably performed layer by layer on forming of the stack. This enables to accurately control the doping in the stack.

Layers 120 are for example doped with one or a plurality of dopants among nitrogen, carbon, and silicon.

Layers 120 are for example layers made of nitrogen-doped germanium and layers 122 are for example an antimony and selenium alloy. In this example, layers 120 are substantially identically doped.

As a variation, the stack may comprise a plurality of assemblies of layers made of different materials, where each assembly may be doped or non-doped. For example, the high portion of stack 110 may be doped with carbon, to decrease the risk of interdiffusion between the material of layer 109 and the material of the upper layer of stack 110, and the lower portion may be doped with nitrogen to increase the crystallization temperature.

Such a layer-by-layer doping has the advantage of allowing the interaction of the dopants with certain elements of the stack, but not with all of them, while keeping a stack having a uniform macroscopic behavior.

As a variation, the stack may comprise at least one assembly of layers having a gradual doping. For example, the doping may increase between the layer of said assembly closest to the lower layer in the stack and the layer of said assembly closest to the upper layer in the stack. For example, the doping of a layer assembly may be non-linear. Thus, along the height of the stack, the doping of this layer assembly may increase and then decrease, or conversely.

Such a gradual doping has the advantage of allowing, for example, the modulation of the resistivity of the phase-change material along its height.

More generally, a selection element such as that described in the present disclosure may be used in another type of memory such as a phase-change memory such as described. Further, the selection element may be located differently with respect to the storage element. For example, a selection element such as that described may be located at the end of each row or column of a memory cell array.

An advantage of the described embodiments is that the doping types described in relation with FIG. 4 cannot be obtained by co-sputtering with a standard deposition technique or by ion implantation.

An advantage of the described embodiments is that the manufacturing method adds no variability between different simultaneously-formed storage elements. The storage elements of a same memory device may thus be in a same state at the initialization, which enables to increase the efficiency of the memory.

Another advantage of the described embodiments is that the amorphous layers of first portion 110 form a thermal insulator. Indeed, the chemical elements in their amorphous state are poorer heat conductors than in their crystalline state. This enables to avoid the propagation of heat from one element to a neighboring element.

Another advantage is that the firing voltage is smaller than that of a selection element comprising a bulk. The manufacturing of selection elements such as described is thus less energy consuming, in particular in devices comprising several tens, or even several thousands, of selection elements.

Another advantage is that the threshold voltage from which the selection element switches from the first state to the second state has a smaller dispersion than in the case of a selection element comprising a bulk.

Another advantage is that it is possible to configure, and to optimize, electric features of the selection element, by using the physical features of the layer stack, for example, the number of layers, the layer thicknesses, the materials of the layers, their doping, etc.

Various embodiments and variants have been described. Those skilled in the art will understand that certain features of these various embodiments and variants may be combined, and other variants will occur to those skilled in the art. In particular, although the lower electrode is, for certain embodiments, described as having an L-shaped cross-section, it should be understood that it is possible for the electrode to have another shape. For example, the electrode may be a conductive layer located in contact with the lower layer of stack 110.

Finally, the practical implementation of the described embodiments and variations is within the abilities of those skilled in the art based on the functional indications given hereabove.

The invention claimed is:

1. A selection element comprising, in a first portion, a stack of at least two amorphous layers, the thickness of each layer in the stack being greater than 1 nm and smaller than or equal to 20 nm, wherein:
the stack comprises at least one assembly of first layers and one assembly of second layers, the first and second layers being made of different materials;
the first layers are made of an alloy comprising a group-15 element and a group-16 element; and
the second layers consist of one or more, nitrogen-doped, oxygen-doped, or carbon-doped group-14 elements.

2. The selection element according to claim 1, wherein at least one of the layers in the stack comprises a group-16 element.

3. The selection element according to claim 1, wherein at least one of the layers in the stack comprises an element among selenium, tellurium, and sulfur.

4. The selection element according to claim 1, wherein the stack comprises an alternation of first and of second layers.

5. The selection element according to claim 1, wherein:
the second layers consist of a nitrogen-doped germanium alloy, and
the first layers are made of an alloy of antimony and of selenium.

6. The selection element according to claim 1, wherein the material of each first layer of the stack has stoichiometric proportions.

7. The selection element according to claim 1, comprising a second portion crossing at least certain layers of the stack, made of an alloy of at least part of the components of the layers of the stack.

8. The selection element according to claim 7, comprising an electrode in contact with the second portion.

9. The selection element according to claim 1, wherein layers of an assembly of layers of the stack are doped.

10. The selection element according to claim 9, wherein the layers of the layer assembly-are doped with one or a plurality of dopants among nitrogen, carbon, and silicon.

11. A memory device comprising a storage element arranged electrically in series with a selection element defined according to claim 1.

12. A selection element comprising, in a first portion, a stack of at least two amorphous layers, the thickness of each layer in the stack being greater than 1 nm and smaller than or equal to 20 nm, wherein:
the stack comprises at least one assembly of first layers and one assembly of second layers, the first and second layers being made of different materials;
the first layers are made of an alloy comprising a group-15 element and a group-16 element;
the second layers consist of one or more, nitrogen-doped, oxygen-doped, or carbon-doped group-14 elements; and
the second layers consist of doped silicon or germanium.

13. A method of manufacturing a selection element comprising forming a stack of at least two amorphous layers, the thickness of each layer being greater than 1 nm and smaller than or equal to 20 nm, wherein:
the stack comprises at least one assembly of first layers and one assembly of second layers, the first and second layers being made of different materials;
the first layers are made of an alloy comprising a group-15 element and a group-16 element; and
the second layers consist of one or more, nitrogen-doped, oxygen-doped, or carbon-doped group-14 elements.

14. The method according to claim 13, comprising a step during which a current pulse is sent through the stack of layers, to form a portion comprising an alloy of at least part of the components of the layers of the stack.

15. The method according to claim 13, comprising a step of manufacturing of a lower electrode and the manufacturing of an upper electrode.

16. A selection element comprising, in a first portion, a stack of at least two amorphous layers, the thickness of each layer in the stack being greater than 1 nm and smaller than or equal to 20 nm, wherein:
the stack comprises at least one assembly of first layers and one assembly of second layers, the first and second layers being made of different materials;
the first layers are made of an alloy comprising a group-15 element and a group-16 element;

the second layers consist of one or more doped or undoped group-14 elements;

the second layers consist of a nitrogen-doped germanium alloy, and the first layers are made of an alloy of antimony and of selenium.

\* \* \* \* \*